United States Patent
Whitten et al.

(10) Patent No.: US 7,053,637 B2
(45) Date of Patent: May 30, 2006

(54) METHOD FOR TESTING SIGNAL PATHS BETWEEN AN INTEGRATED CIRCUIT WAFER AND A WAFER TESTER

(75) Inventors: Ralph G. Whitten, San Jose, CA (US); Benjamin N. Eldridge, Danville, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 10/756,477

(22) Filed: Jan. 12, 2004

(65) Prior Publication Data
US 2004/0148122 A1 Jul. 29, 2004

Related U.S. Application Data

(63) Continuation of application No. 09/548,885, filed on Apr. 13, 2000, now Pat. No. 6,724,209.

(51) Int. Cl.
*G01R 31/02* (2006.01)

(52) U.S. Cl. ...................................................... 324/754

(58) Field of Classification Search ................ 324/754, 324/763, 765, 158.1
See application file for complete search history.

(56) References Cited

U.S. PATENT DOCUMENTS

| | | | | |
|---|---|---|---|---|
| 5,663,900 A | * | 9/1997 | Bhandari et al. | 364/578 |
| 5,736,850 A | * | 4/1998 | Legal | 324/754 |
| 5,929,651 A | * | 7/1999 | Leas et al. | 324/754 |
| 6,158,030 A | * | 12/2000 | Reichle et al. | 714/724 |
| 6,351,134 B1 | * | 2/2002 | Leas et al. | 324/765 |
| 6,476,630 B1 | * | 11/2002 | Whitten et al. | 324/765 |
| 6,724,209 B1 | * | 4/2004 | Whitten et al. | 324/763 |

* cited by examiner

*Primary Examiner*—Jermele Hollington
(74) *Attorney, Agent, or Firm*—Thomas A. Ward

(57) ABSTRACT

Signal paths within an interconnect structure linking input/output (I/O) ports of an integrated circuit (IC) tester and test points of an IC die on a wafer are tested for continuity, shorts and resistance by using the interconnect structure to access a similar arrangement of test points on a reference wafer. Conductors in the reference wafer interconnect groups of test points. The tester may then test the continuity of signal paths through the interconnect structure by sending test signals between pairs of its ports through those signal paths and the interconnecting conductors within the reference wafer. A parametric test unit within the tester can also determine impedances of the signal paths through the interconnect structure by comparing magnitudes of voltage drops across pairs of its I/O ports to magnitudes of currents it transmits between the I/O port pairs.

9 Claims, 6 Drawing Sheets

METHOD FOR TESTING SIGNAL PATHS BETWEEN AN INTEGRATED CIRCUIT WAFER AND A WAFER TESTER

This application is a continuation of application Ser. No. 09/548,885 filed Apr. 13, 2000, now U.S. Pat. No. 6,724,209.

BACKGROUND OF THE INVENTION

1. Field of the Invention

The present invention relates in general to wafer-level integrated circuit (IC) testers, and in particular to a method for verifying signal paths through a structure interconnecting an IC tester to an IC wafer to be tested.

2. Description of Related Art

Many integrated circuit (IC) testers test ICs while the ICs are still in the form of die on a semiconductor wafer. A typical wafer tester includes a chassis called a "test head" containing printed circuit boards implementing the circuits that test a wafer. The test circuits are usually organized into a set of similar "channels", with each channel including all the circuitry needed to generate a test signal input to one test point on the wafer and to monitor any wafer output signal produced at that test point. Each channel usually has a single bi-directional input/output (I/O) port though which it communicates with the wafer test point, though some employ two unidirectional ports.

An interconnect structure residing between the test head and the wafer provides signal paths between the channels' I/O ports and test points on the wafer. Interconnect structures make contact with the test head I/O ports and the wafer test points in various ways. For example with the test head residing above the interconnect structure, a channel's I/O port may access contact pads on an upper surface of a interconnect structure via a set of pogo pin connectors extending downward from the test head. The interconnect structure in turn may access the test points of the IC die via a set of small probes. The probes may be attached to an under surface of an interconnect structure and may contact pads on the upper surface of the wafer when the wafer is moved into position under the interconnect structure. Alternatively, the probes may be implemented as spring contacts formed on the surface of the wafer itself, with tips of the spring contacts accessing contact pads on the under surface of interconnect structure.

Since the test head is relatively large, the tester channels' I/O ports are distributed over a much wider horizontal area than the test points on the relatively small IC die they must access. Thus regardless of how the interconnect structure is implemented, it must provide a large number of signal paths extending in both horizontal and vertical directions in order to interconnect the channel I/O ports to the test points on the wafer. Thus the interconnect structure is often a relatively complicated structure including more than one interconnected signal routing layer. The signal paths through the interconnect structure may also include components such as small resistors or capacitors.

Before testing a wafer we would like to confirm that the interconnect structure can provide the necessary signal paths between the test head and the wafer. A connection failure may arise, for example, due to a misalignment of pogo pins or probes with their intended contact points, a broken, missing or contaminated pogo pin, probe or contact pad, a misalignment between contact structures within internal layers within the interconnect structure, an open circuit or short circuit fault between conductors within the interconnect structure or within the test head, or defective or missing discrete components in the signal paths through the interconnect structure. In many applications we also would like to verify that the resistance of a signal path between each test head I/O port and a corresponding test point on wafer is within acceptable limits. Contactor assemblies are usually designed to provide signal paths having particular resistances, and any variation from the intended resistance, due for example to corrosion or contamination on contact pads or the tips of probes or pogo pins, can distort test results.

Shorts, continuity and resistances of signal paths within a interconnect structure are usually tested during the manufacturing process using conventional resistance and continuity testing equipment accessing opposite ends of the signal paths via small probes. However signal paths within a probe assembly can later fail when in use in an integrated circuit tester, and it is difficult and inconvenient to periodically remove a probe assembly from a tester and manually test the continuity and resistance of its signal paths. Open and short circuit signal path failures can often be detected, or at least suspected, because they usually lead to characteristic patterns of IC test failures. However when a signal path has a resistance that is marginally out of an acceptable range, wafer test failures may not exhibit a clear pattern, and die can be improperly rejected as failing a test when the source of the failure was in fact the interconnect structure.

What is needed is a convenient method for quickly testing for shorts, continuity and resistances of signal paths through a interconnect structure without having to remove it from its working environment.

SUMMARY OF THE INVENTION

A interconnect structure typically provides multiple signal paths between input/output (I/O) ports of an integrated circuit (IC) tester and test points of an IC wafer to be tested. In accordance with one aspect of the invention, the ability of the interconnect structure to connect the IC tester's I/O ports to the wafer's test points is verified by first employing the interconnect structure to interconnect those I/O ports to a similar arrangement of test points on a reference wafer.

The reference wafer, similar in size and shape to the wafer to be tested, includes conductors linking groups of the test points. When the tester generates a test signal at one of its I/O ports, that signal travels through the interconnect system to a test point on the reference wafer. A conductor within the wafer then conveys the test signal to another of the test points. The test signal then travels from that reference point back through the interconnect structure to another I/O port of the IC tester. The continuity of signal path from any tester I/O port to a test point on the reference wafer can therefore be tested by programming the tester to transmit a test signal to the reference wafer via that I/O port and to look for the signal as it returns via another of the I/O ports.

The resistance of a signal paths through the interconnect structure is measured by transmitting signals of known current between I/O ports linked through those signal paths and the reference wafer and to measure the voltage drop between the two I/O ports. Alternatively the tester may place a known voltage across two linked I/O ports and measure the current passing between them. In either case the resistance of the system signal path between the two ports is then computed from the test signal voltage and current. When this procedure is repeated to measure resistance between various combinations of I/O ports, the path resistance between each tester I/O port and the wafer test point to which it is connected can be computed from the results.

Shorts between a selected signal path and any other signal path through the interconnect structure can be tested by removing the reference wafer, programming one tester channel to apply a test signal to the selected signal path and programming other tester channels to look for the appearance of that signal on the other signal paths.

It is accordingly an object of the invention to provide means for verifying that an interconnect system is capable of providing continuous signal paths between ports of an IC tester and test points on a wafer to be tested.

It is another object of the invention to provide means for measuring resistance of signal paths through a interconnect structure linking ports of an IC tester and test points on the wafer to be tested.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

DESCRIPTION OF THE PREFERRED EMBODIMENT(S)

The present invention relates to a method and apparatus for testing signal paths through any kind of interconnect structure for conveying signals between input/output (I/O) ports of a wafer level integrated circuit (IC) tester and test points on an IC wafer to be tested. Since the nature of the invention is best understood in the context of an IC tester architecture, a typical IC tester architecture is briefly outlined below.

Integrated Circuit Tester

Figure 1:
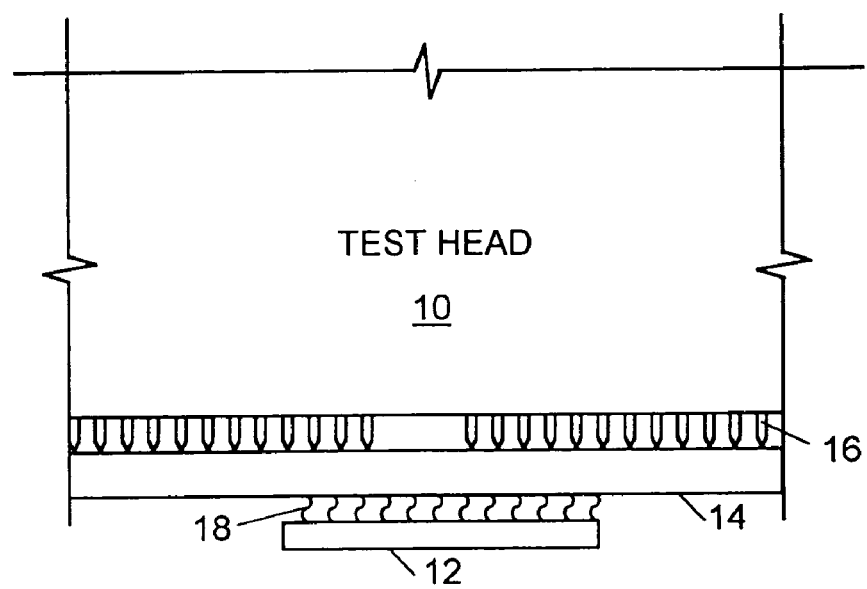
FIG. 1 is a simplified partial elevation view of a test head of a typical prior art integrated circuit (IC) tester accessing a wafer under test via a conventional interconnect structure.
Figure 2:
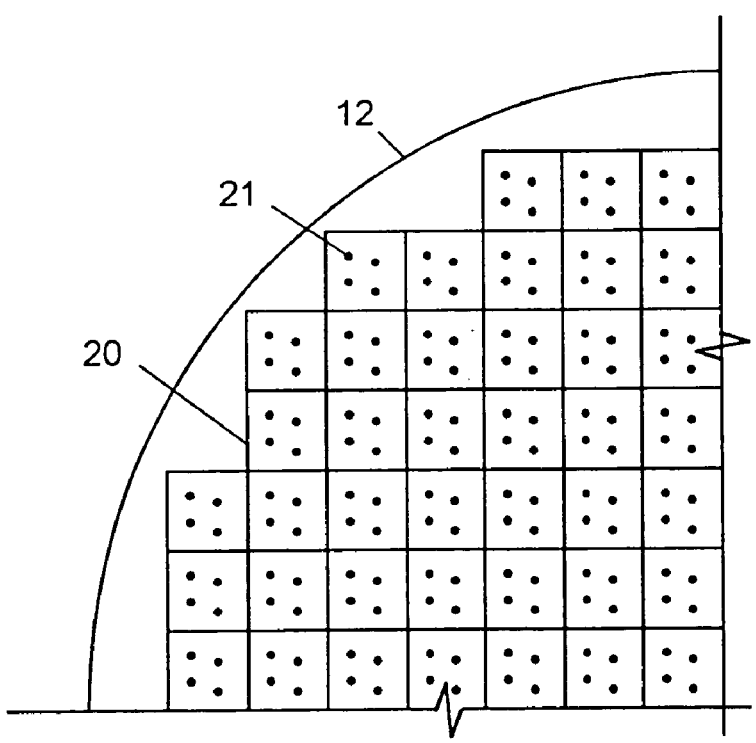
FIG. 2 is a simplified partial plan view of a portion of a typical wafer.
Figure 3:
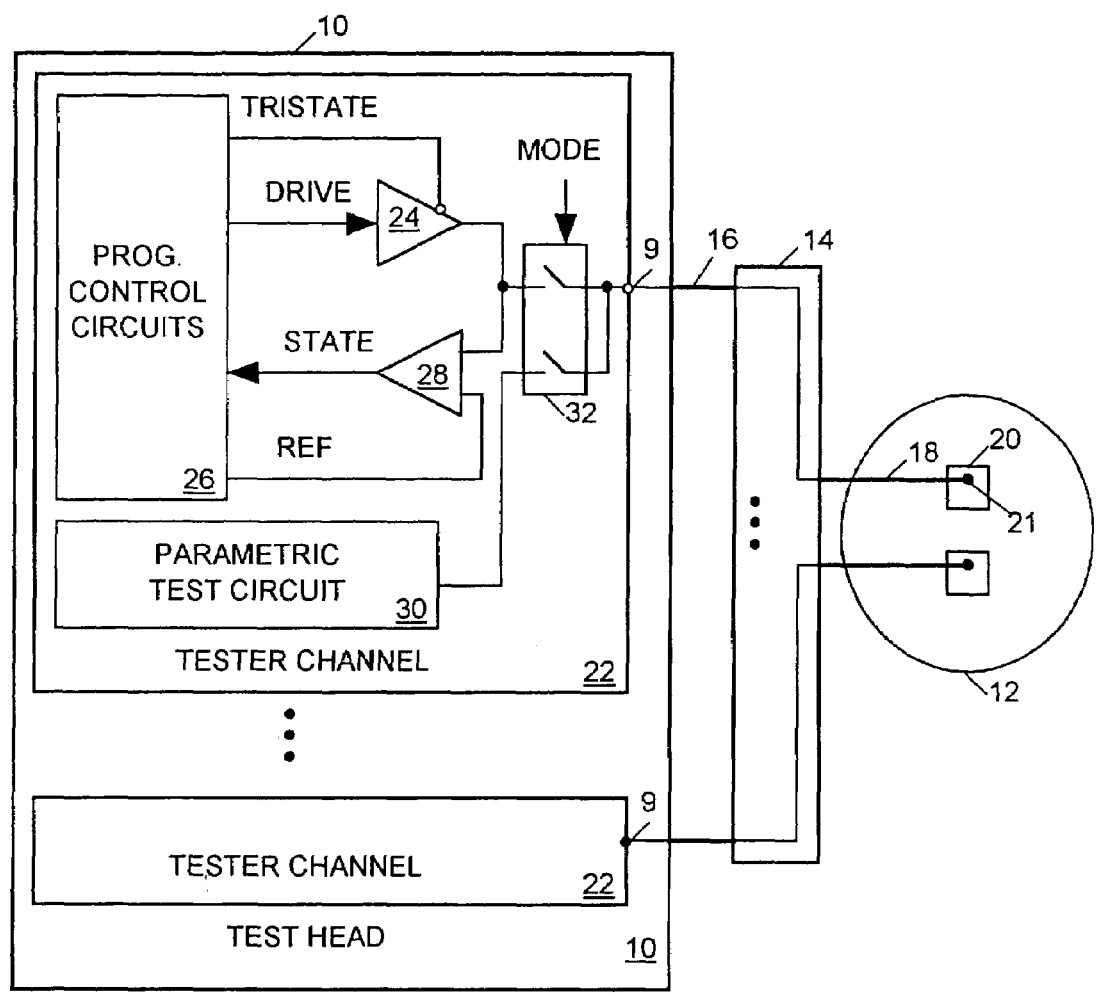
FIG. 3 represents in simplified block diagram form prior art tester channels implemented by the test head of FIG. 1 accessing pads of an IC wafer via an interconnect structure.

FIG. 1 is a simplified partial elevation view of a test head 10 of a typical prior art IC tester accessing test points on a wafer under test 12 via a conventional interconnect structure 14. FIG. 2 is a plan view of a portion of a wafer 12, and FIG. 3 is a simplified block diagram representing tester circuits mounted in test head 10 of FIG. 1. Referring to FIGS. 1–3, test head 10 holds a set of circuit boards implementing circuits for carrying out both digital and analog tests on ICs implemented in the form of die 20 on wafer 12. In this example each die 20 includes several test points 21 providing signal input/output (I/O) access to the circuits the die implement. For simplicity FIG. 2 illustrates each die 20 as having only four test points 21, but IC die typically have a much larger number of test points. I/O ports 9 of test head 10 access pads on an upper surface of interconnect structure 14 via a set of pogo pin connectors 16.

Interconnect structure 14 accesses test points 21 on wafer 12 via a set of probes 18 and provides signal paths between test points 21 and probes 18. A test point 21 may, for example, be a conductive pad on the surface of wafer 12, and in such case probes 18 are attached to an under surface of interconnect structure 14 and have tips for contacting pads on the surface of wafer 12 acting as test points 21. Or, as another example, probes 18 may be implemented as spring contacts attached to pads on the surface of wafer 12 itself, and in such case the probe tips themselves become "test points" that are contacted by pads on the under surface of interconnect structure 14.

Test head 10 holds several circuit boards implementing a set of tester channels 22 for accessing test points 21 of wafer 12. Each channel 22 may include a tristate driver 24 for transmitting a digital test signal to the corresponding test point 21 and a comparator 28 for receiving an IC output signal produced at that pad. During a digital test, programmable control circuits 26 within each channel 22 supply signals (TRISTATE and DRIVE) to tristate control and drive inputs of driver 24 to set the state (high, low or tristate) of the test signal sent to test point 21. Control circuits 26 may also supply a reference voltage (REF) to an input of comparator 28. Comparator 28 supplies an output signal (STATE) control circuit 26 to signal whether the IC output signal is higher or lower in voltage than the REF signal, thereby indicating the logic state of the IC output signal.

Each channel 22 may also include a parametric test circuit 30 for carrying out an analog test, such as for example a leakage current test, at an IC test point. A pair of relays 32, controlled by control data (MODE), may connect driver and comparators 24 and 28 to the channels' I/O port 9 during digital tests or may connect parametric test circuit 30 to I/O port 9 during parametric tests. In some tester architectures a single parametric test circuit may be shared by several channels.

Interconnect Testing Apparatus

Since pogo pins 16 are distributed over a much wider horizontal area than probes 18, interconnect structure 14 must provide signal paths extending in both horizontal and vertical directions to interconnect pogo pins 16 and probes 18. Interconnect structure 14 may also incorporate components such as discrete resistors or capacitors into those signal paths. Thus interconnect structure 14 may be a relatively complicated device having more than one interconnected layers and components. Before testing wafer 12, we would like to confirm that interconnect structure 14 will be able to provide a signal path of appropriate resistance between each test head I/O port 9 and the test point 21 on wafer 12 it is to access.

In accordance with the invention, to test the signal paths through interconnect structure 14, we first provide a reference wafer similar in size and shape to the wafer to be tested, the reference wafer providing a pattern of test points on its surface mimicking the pattern of test points on the surface of wafer 12. Thus when the reference wafer is positioned under interconnect structure 14, each of probes 18 will contact a corresponding test point of the reference wafer, assuming the probes are properly arranged. In some cases, as discussed below, the reference wafer may also include additional test points ("reference points") on its surface. Conductors implemented within the reference wafer link groups of the reference wafer's test points with one another and with any provided reference points. Interconnect structure 14 is also modified, when necessary, to include additional probes 18 and signal paths to link each reference point on the reference wafer to a spare tester channel within test head 10.

To test the continuity of a signal path between a first tester channel and a test point on the surface of the reference wafer, the first tester channel is programmed to send a test signal, for example a square wave signal, at its I/O port. That test signal then travels to the test point via a path on interconnect structure 14. A conductor within the reference wafer then forwards the test signal to one of the other test or reference points on the wafer. The test signal then travels back through interconnect structure 14 to the I/O port of a second tester channel that is programmed to detect whether the signal appears at its I/O port. Thus we can determine whether interconnect structure 14 has provided a signal path between the first tester channel and its corresponding test point by determining whether the second tester channel has detected the returning signal. As discussed in detail below, parametric test circuits within the tester may also be employed to measure resistances of the various signal paths between the tester and the reference wafer.

Figure 4:
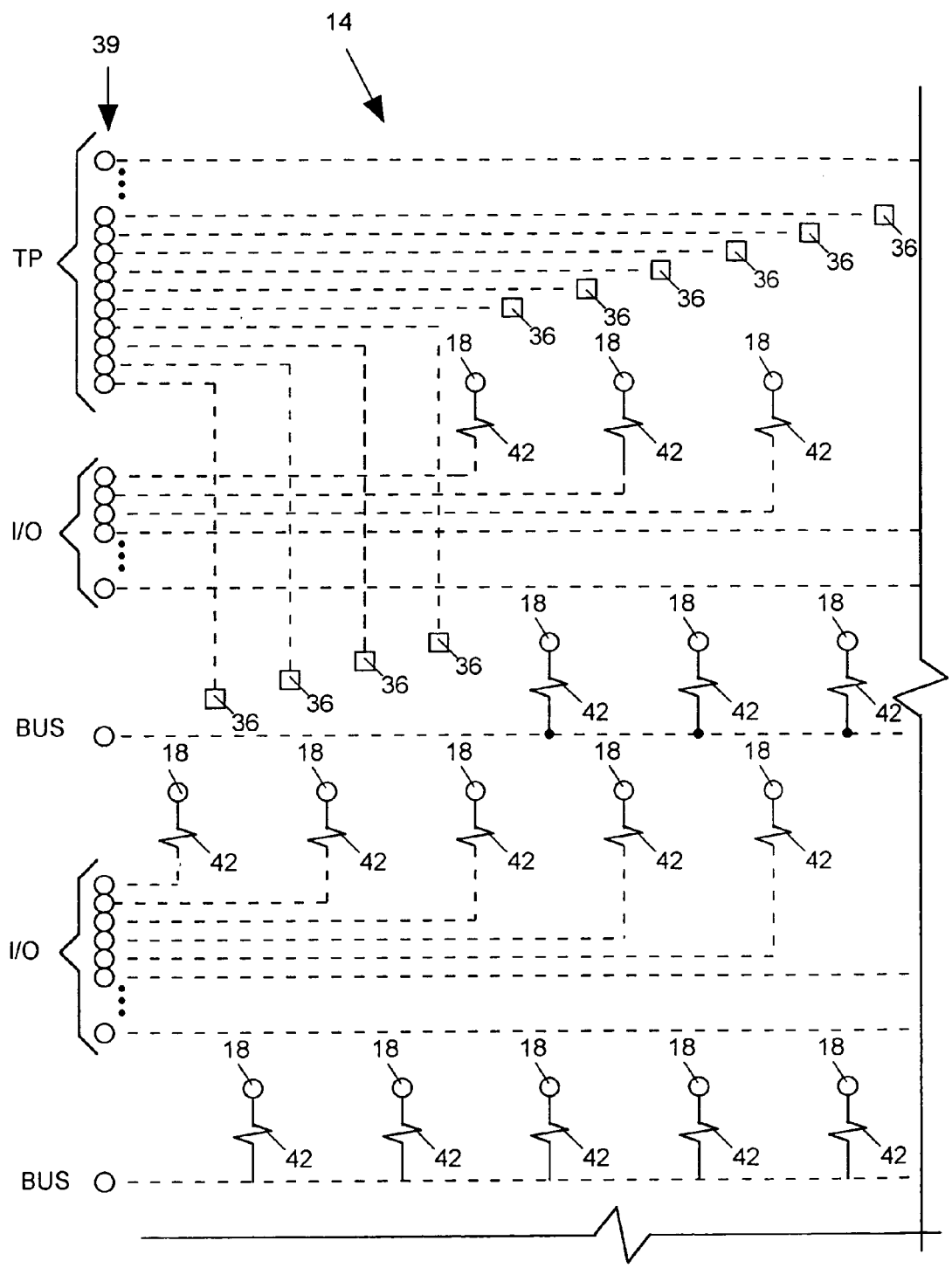
FIG. 4 is a simplified plan view of a portion of the under surface of a interconnect structure in accordance with the invention.

FIG. 4 is a simplified plan view of a portion of the under surface of a interconnect structure 14 including the probes 18 (represented as small circles) for contacting the test points on the reference wafer. In accordance with the invention, interconnect structure 14 has been modified to also include a set of probes 36 (represented in FIG. 4 by small squares) for contacting additional reference points on the reference wafer. A set of signal paths (TP, I/O and B) through interconnect structure 14 link probes 18 and 36 to contact pads (pogo pin pads) 39 on the upper surface of interconnect structure 14 accessed by the tester channel via pogo pins. The resistance of the signal paths between each tester channel and each probe 18 is symbolically represented in FIG. 4 by resistors 42. Each I/O path conveys a signal between a single tester channel I/O port and a corresponding probe 18 accessing a normal test point on the wafer. Thus a tester channel accessing an I/O line accesses only a single test point on the wafer to be tested. Each additional path (TP) links a spare tester channel to one of probes 36 for accessing reference points on the reference wafer. Interconnect structure 14 may also provide a "bus path" (BUS) linking one tester channel to several probes 18 so that the tester channel may concurrently access several test points on a wafer via one BUS path. Two such BUS paths appear in FIG. 4.

Figure 5:
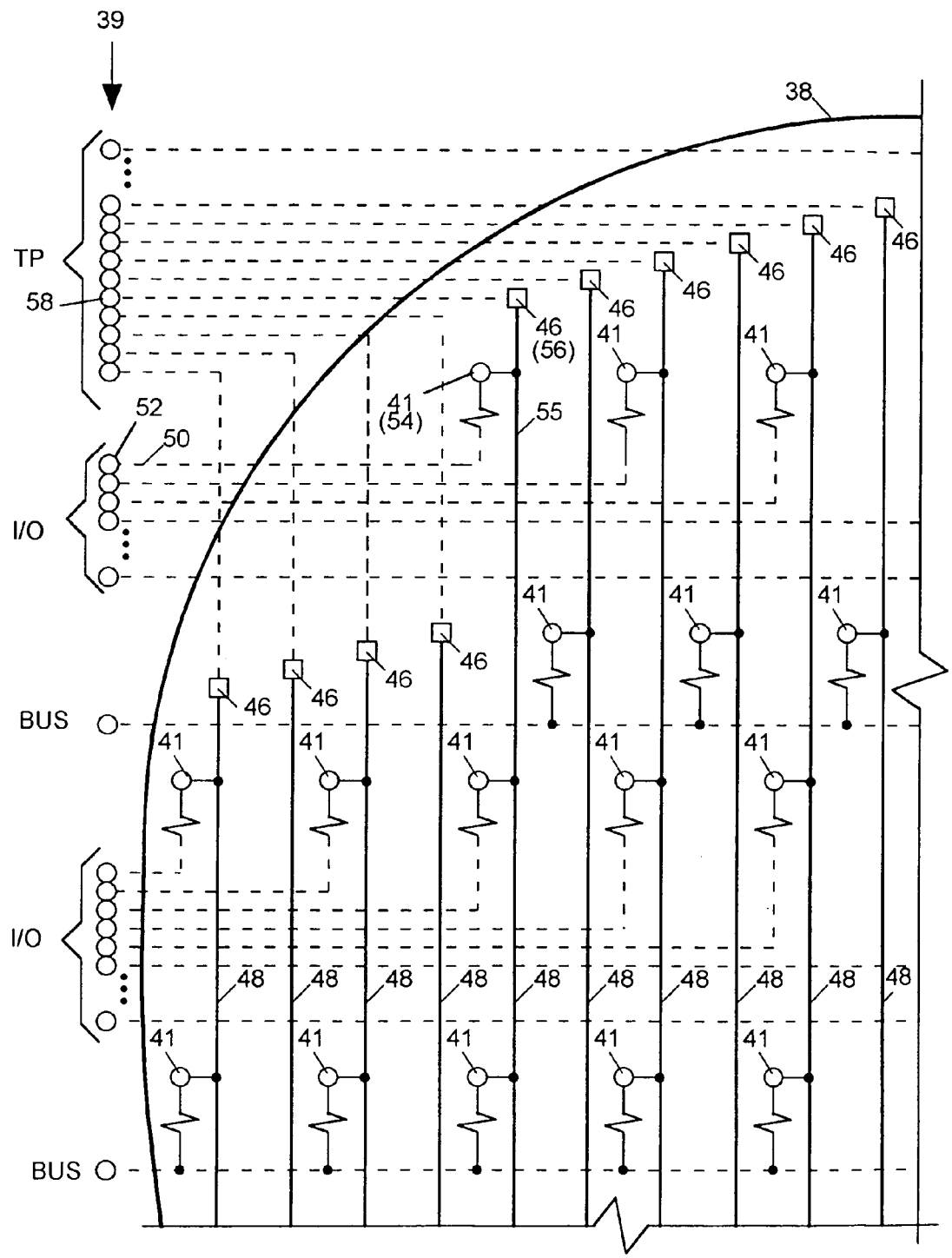
FIG. 5 is a simplified plan view of a reference wafer in accordance with the invention.

FIG. 5 is a simplified plan view of the reference wafer 38, including a set of test points 41 contacted by probes 18 of FIG. 4, with pads 41 being arranged to mimic the distribution of contact test points 21 on the surface of the wafer 12 (FIG. 2) to be tested. Reference wafer 38 also includes an additional set of reference points 46 accessed by probes 36 of FIG. 4. A set of conductors 48 implemented within reference wafer 38 link groups of reference and test points. The signal paths (I/O, TP and BUS) through interconnect structure 14 leading to the pads 39 on the surface of interconnect structure 14 are also shown in FIG. 5 as dotted lines. While each conductor 48 may link a large number of test points 41 to a given reference point 46, conductors 48 are arranged so that test points 41 accessed by a common BUS path are linked to separate reference points 46.

Continuity Testing

Referring to FIGS. 1 and 5, we wish to test the continuity of a particular I/O signal path 50 between a tester channel port linked to a particular pogo pin pad (pad 52) and a particular one of wafer test points 41 (point 54). Note that one of conductors 48 (conductor 55) links test point 54 to one of reference points 46 (point 56) and that reference point 56 is linked to another pogo pin pad 58. To test the continuity of the path between the tester channel linked to pogo pin pad 52 and test point 54, we program the IC tester to tristate all drivers 24 (FIG. 1) linked to conductor 48 other than the particular driver 24 linked to pogo pin pad 52. That driver is programmed to generate a square wave test signal that toggles between high and low logic levels. If the path 50 between pad 52 and pad 54 is continuous, then the test signal will appear at pad 54. Conductor 55 will convey the test signal to reference point 56 which will then forward that test signal to a spare tester channel accessing pogo pin pad 58. That spare tester channel is programmed to look for an incoming square wave test signal that toggles between high and low logic levels in the expected manner. Since it can concurrently access several reference points 46 by using multiple tester channels, the tester can test several signal paths in this manner at the same time. However signal paths connected to the same reference point 46 must be tested sequentially.

A continuity test can falsely indicate that an I/O signal path between the tester and a test point 41 is defective when in fact it is the TP signal path between the tester and a reference point 46 that is defective. However such a source of the continuity failure will be apparent because a defective TP signal path will cause all I/O and BUS signal paths linked to the same TP signal path to appear to be defective.

When there is more than one BUS path is it preferable to provide a separate conductor 48 and reference point 46 for each test point 41 accessed via a BUS path so that all BUS paths are isolated from one another. This allows the continuity of BUS paths to be concurrently tested in the same way continuity of I/O paths are tested. However when there are many BUS paths it may be impractical to provide a separate conductor 48 and reference point 46 for each test point 41 accessed by a BUS path. In such case test points 41 accessed by separate BUS paths path may be linked to the same conductor 48. However when we do that we must isolate the BUS paths from one another by programming the tester channels to ground all conductors 48 other than one being accessed by a particular BUS path of interest whose continuity is to be tested. We program the tester channel accessing that particular BUS path of interest to place a test signal on that BUS path and program the spare tester channel accessing the ungrounded conductor 48 via a test point 46 to look for the returning test signal. Since the other conductors 48 are grounded, the test signal cannot find a path to the ungrounded conductor other than through the path whose continuity is being tested. Thus while the continuity of BUS path connections can be tested using this method, they must be done so consecutively rather than concurrently.

Impedance Testing

The reference wafer is also useful when testing the resistance 42 (FIG. 4) of each signal path through interconnect structure 14. That path resistance includes the inherent resistance of the conductors forming the path, but may also include discrete resistors inserted into the signal path within interconnect structure 14.

Figures 6, 7:
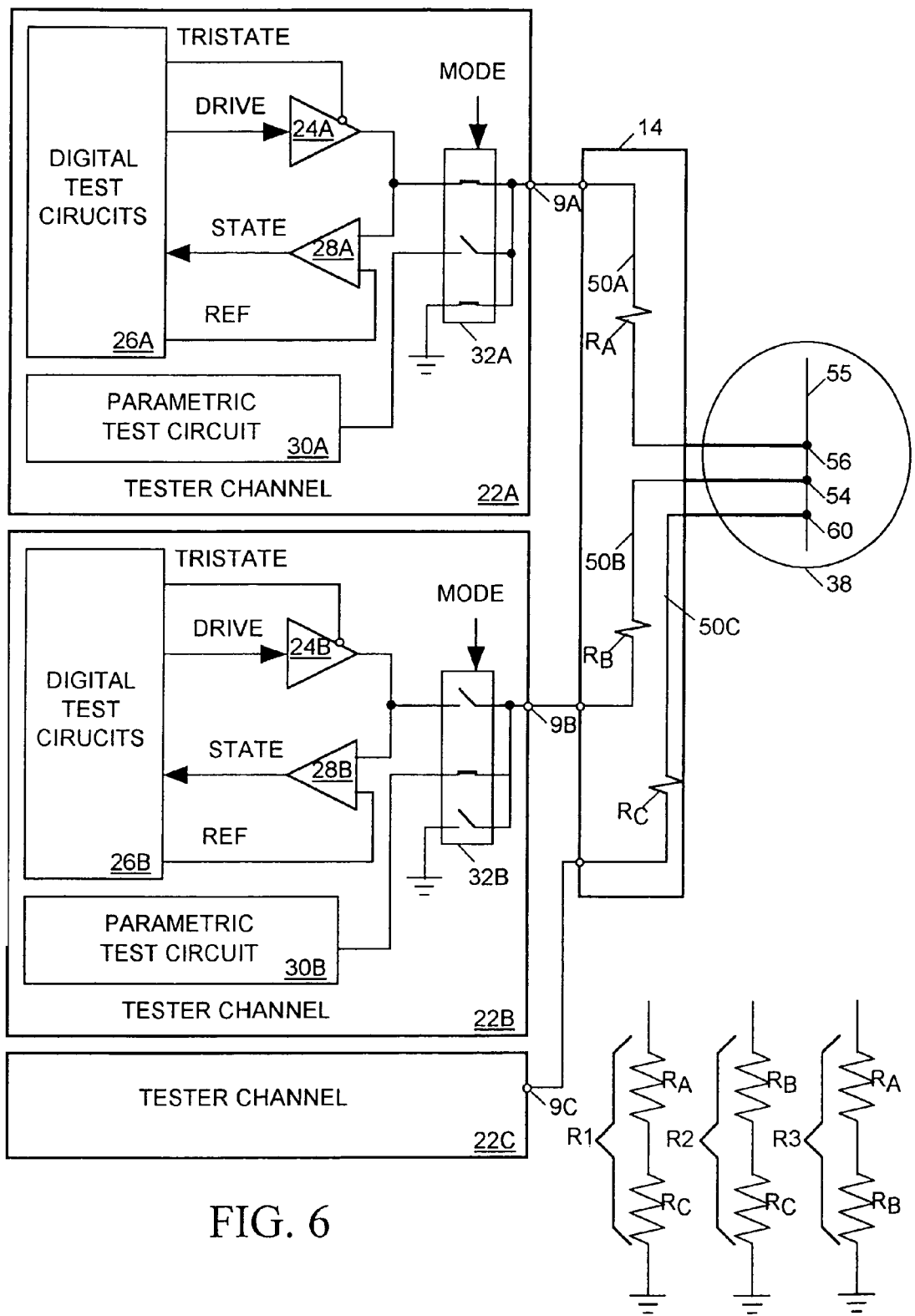
FIG. 6 illustrates in simplified block diagram form a pair tester channels in accordance with the invention accessing pads on an IC wafer via an interconnect structure.
FIG. 7 illustrates a set of paths through which signals are routed when measuring path resistances.

FIG. 6 illustrates a set of three tester channels 22A–22C similar to prior art tester channels 22 of FIG. 2. Interconnect structure 14 links channels 22B and 22C to test points 54 and 60 on reference wafer 38 via paths 50B and 50C and links channel 22A to a reference point 56 via path 50A. A conductor 55 within reference wafer 38 interconnects all three pads 54, 56 and 60.

To measure the resistance $R_B$ of path 50B, relay 32A of channel 22A is set to connect driver 24A to I/O port 9A, and the DRIVE signal input to driver 24A of channel 22A is set to drive its output low, to effectively ground output port 9A. The relays 32B of channel 22B are set to connect the channel's parametric test circuit 30B to its I/O port 9B. Parametric test circuit 30B then generates at port 9B a DC signal of known voltage and measures the resulting current passing though port 9B. Alternatively, parameter test circuit 30B may send a current of known magnitude though port 9B and measure the resulting voltage at port 9B. In either case, the signal voltage divided by the signal current is substantially equal to the total signal path resistance $R_A+R_B$ between port 9B and ground, assuming that driver 24A has negligible resistance to ground when the DRIVE signal is set to pull its output down. When the resistance to ground of driver 24A is not negligible but is known, it may be subtracted from the calculated resistance to find path resistance $R_A+R_B$. Alternatively an additional relay 32A can be provided to directly ground terminal 9A during the measurement, thereby bypassing the resistance of driver 24A. When path 50B includes an embedded resistor $R_B$ that is very much larger than the inherent resistance of $R_A$ of return path 50A, the calculated path resistance value $R_A+R_B$ will be sufficiently close to the resistance of resistor $R_B$ that it may be taken as its value.

On the other hand, when the resistance $R_A$ of path 50A is not negligible, we can employ additional procedures to determine the magnitude of resistor $R_B$ alone. Suppose as illustrated in FIG. 7 we employ the resistance measurement procedure outlined above three times to measure the total resistance R1 of signal paths 50A and 50C, the total resistance R2 of paths 50B and 50C, and the total resistance R3 of paths 50A and 50B. We now have three equations in three unknowns ($R_A$, $R_B$ and $R_C$):

$$R_A+R_C=R1$$

$$R_B+R_C=R2$$

$$R_A+R_B=R3$$

Solving for $R_A$, $R_B$ and $R_C$ we have, $$R_A=(+R1-R2+R3)/2$$

$$R_B=(-R1+R2+R3)/2$$

$$R_C=(+R1+R2+R3)/2$$

Therefore, as long as reference wafer 38 links all test or reference points in groups of at least three, we can use the above-described procedure and calculations to determine the resistance of each path between an I/O port of the tester channel and a test or reference point on the reference wafer to which it is linked.

Note that it is not necessary to provide reference points 36 on reference wafer 38 in order to test the interconnect structure signal path continuity and resistance, provided the conductors 42 within reference wafer 38 connects each test point 41 to other test points 41. In such case one test point 41 can act as a reference point when testing signal path continuity or resistance of paths to other test points.

The impedance of a BUS path between a tester channel and any test point 41 connected to a conductor 48 can be tested as described above provided no other BUS path is linked to the same conductor 48.

Reference Wafer with Active Circuits

Figure 8:
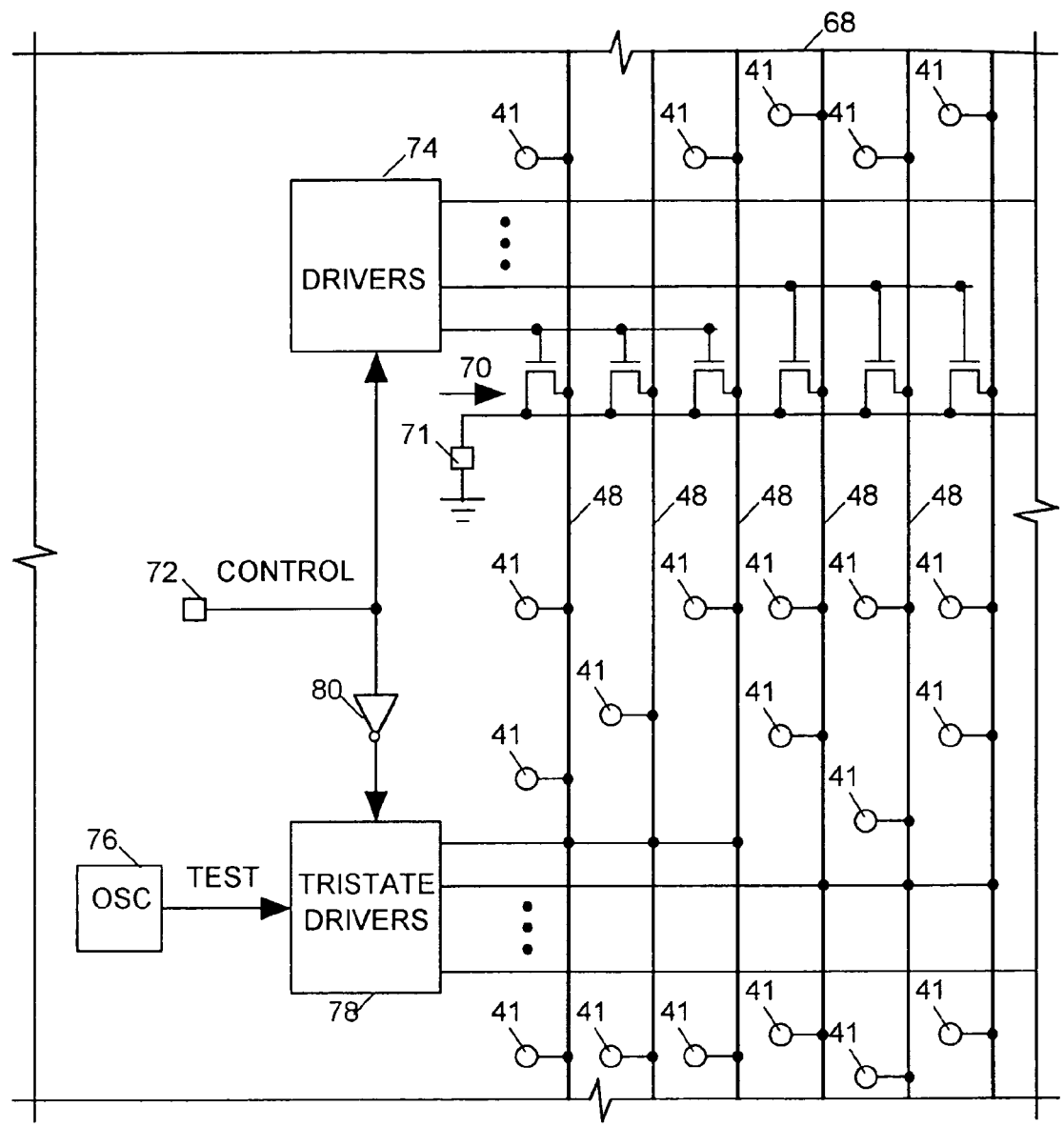
FIG. 8 and illustrates in schematic diagram form an alternative embodiment of a portion of a reference wafer in accordance with the invention.

FIG. 8 illustrates in schematic diagram form an alternative embodiment of a portion of a reference wafer 68 also having a test points 41 arranged in a manner similar to an arrangement of test points on a DUT to be accessed by an interconnect structure. Test points 41 are linked by conductors 48 within wafer 68. Reference wafer 68 includes a test point 71 connected through a low impedance path to external ground potential and a set of pass transistors 70, each connected between one of conductors 48 and ground via test point 71. An additional test point 72 accessible by a spare tester channel via the interconnect structure is connected to an input of each of a set of drivers 74 controlling the gates of pass transistors 70.

Wafer 68 also includes an oscillator 76 supplying a test signal (TEST) as input to a set of tristate drivers 78 having outputs tied to conductors 48. An inverter 80 couples test point 72 to tristate control inputs of drivers 78. When the spare channel asserts the control signal at test point 72, drivers 74 turn on transistors 70 and drivers 78 are tristated. When the spare channel de-asserts the control signal at test point 72, drivers 74 turn off transistors 70 and tristate drivers 78 buffer the TEST signal output of oscillator 76 onto conductors 48.

To test the continuity of signal paths through a interconnect structure linking test points 41 to IC tester channels, the spare tester channel causes drivers 74 to turn off pass transistors 70 so that they do not ground conductors 48. The spare tester channel also turns on drivers 78 so that they buffer oscillating TEST signals onto conductors 48. The TEST signal travels back to the tester channels via test points 41 and the interconnect structure's signal paths. Each tester channel is programmed to monitor its own I/O port to determine whether the TEST signal is received, thereby confirming continuity of the signal path through the interconnect structure.

To measure the resistance of the various signal paths through the interconnect structure, the spare tester channel tristates drivers 78 and signals drivers 74 to turn on pass transistors 70 so that they ground conductors 48. Parametric test units in the tester channels may then directly measure the total path resistance between each channel's output port and ground. When necessary an estimated resistance of each pass transistor 70 and resistance to ground from point 71 can be subtracted from each resistance measurement to provide an estimate of the resistance of each the signal path through the interconnect structure.

When only the signal path continuity through the interconnect structure is to be tested, and no path resistance is to be measured, drivers 74 and pass transistors 70 may be omitted from reference wafer 38. Test point 72 and inverter 80 may also be omitted from wafer 38 since drivers 78 need not be tristate drivers.

When only signal path resistance is to be measured, and there is to be no continuity testing, conductors 48 may be permanently grounded. In such case, test point 72, drivers 74, and 78, oscillator 76, and inverter 80 would be omitted from wafer 38.

Short Testing

A short between any selected signal path and any other signal path through interconnect structure 14 can be detected by removing the reference wafer so that all signal paths are open-circuited, programming a tester channel to apply a test signal to the selected signal path, and programming the other tester channels to look for the appearance of that signal on any other signal path.

Thus has been described a system for testing continuity and resistance signal paths through any kind of interconnect structure linking ports of an integrated circuit tester to points of an IC wafer under test. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A method of testing an interconnect structure, comprising:
   providing a semiconductor device tester having a plurality of ports;
   providing an interconnect structure to interconnect ones of the plurality of ports with corresponding ones of a plurality of probes, wherein the plurality of probes are in an arrangement substantially similar to an arrangement of die pads on a semiconductor wafer of semiconductor devices;
   associating a first one of the probes, the first one of the probes having a corresponding first port on the semiconductor tester, with a second one of the probes, the second one of the probes having a corresponding second port on the semiconductor tester, thereby establishing an expected signal path from the first port to the second port; and
   transmitting a test signal on the first port; and
   determining whether an expected signal appears at the second port.

2. The method in accordance with claim 1 wherein the associating comprises providing a test wafer having a plurality of contact pads in an arrangement substantially similar to the arrangement of die pads and a conductor making an electrical connection between a first contact pad in a first location on the wafer corresponding to the first probe and a second contact pad in a second location on the wafer corresponding to the second probe.

3. The method in accordance with claim 1 further comprising measuring a voltage at the second port.

4. The method in accordance with claim 3 further comprising computing a ratio of said voltage to a current of said test signal.

5. A method of producing a tested interconnect structure, comprising:
   providing an integrated circuit (IC) tester having a plurality of ports;
   providing an interconnect structure to interconnect ones of the plurality of ports with corresponding ones of a plurality of probes, wherein the plurality of probes are in an arrangement substantially similar to an arrangement of die pads on a semiconductor wafer of semiconductor devices;
   providing a reference wafer having a plurality of test pads in an arrangement substantially similar to the arrangement of die pads, a reference point, and at least one conductor interconnecting said test pads with said reference point, the test pads and the reference point adapted to contact respective ones of the probes; and
   transmitting a test signal on one of the ports expectedly connected to a one of said test pads via a first probe tip; and
   measuring an expected signal on a port expectedly connected to the reference port via a second probe tip.

6. The method in accordance with claim 5 further comprising:
   grounding another of said ports expectedly connected to another of said test pads; measuring a magnitude of said test signal; and
   calculating a path resistance in accordance with the measured magnitude of said test signal.

7. The method in accordance with claim 5 further comprising:
   open circuiting another of said ports expectedly connected to another of said test pads;
   measuring a magnitude of said test signal; and
   calculating a path resistance in accordance with the measured magnitude of said test signal.

8. The method in accordance with claim 5 further comprising:
   measuring a magnitude of said test signal; and
   calculating a path resistance in accordance with the measured magnitude of said test signal.

9. A method of producing a tested probe card assembly comprising,
   providing an integrated circuit (IC) tester having test ports:
   providing semiconductor devices having first test points on a wafer to be tested;
   providing a reference wafer having a plurality of second test points in an arrangement matching an arrangement of the first test points, and a conductor interconnecting at least two of the second test points;
   providing a probe card assembly to interconnect at least a portion of the second test points with at least a portion of the test ports;
   transmitting a test signal from one of the test ports of the IC tester to another of said test ports via a signal path within said probe card assembly and said conductor; and
   determining whether the test signal arrives at said another of the test ports.

* * * * *